(12) United States Patent
Kowal

(10) Patent No.: US 10,943,767 B1
(45) Date of Patent: Mar. 9, 2021

(54) DIGITAL SAMPLING TO CONTROL RESONATOR FREQUENCY AND PHASE IN A LINAC

(71) Applicant: Applied Materials, Inc., Santa Clara, CA (US)

(72) Inventor: Keith E. Kowal, Swampscott, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/738,021

(22) Filed: Jan. 9, 2020

(51) Int. Cl.
| | |
|---|---|
| *H01J 37/32* | (2006.01) |
| *H05H 7/18* | (2006.01) |
| *H05H 7/22* | (2006.01) |
| *G06F 1/04* | (2006.01) |
| *H01J 37/08* | (2006.01) |
| *H01J 27/02* | (2006.01) |
| *H03L 7/081* | (2006.01) |
| *H03M 1/12* | (2006.01) |
| *H05H 9/04* | (2006.01) |

(52) U.S. Cl.
CPC .......... *H01J 37/32155* (2013.01); *G06F 1/04* (2013.01); *H01J 27/022* (2013.01); *H01J 37/08* (2013.01); *H01J 37/32146* (2013.01); *H01J 37/32174* (2013.01); *H03L 7/0814* (2013.01); *H03M 1/121* (2013.01); *H03M 1/1245* (2013.01); *H05H 7/18* (2013.01); *H05H 7/22* (2013.01); *H05H 9/04* (2013.01)

(58) Field of Classification Search
CPC .......... H01J 37/32155; H01J 37/32174; H01J 37/08; H01J 37/32146; H01J 27/022; H03L 7/0814; H05H 7/18; H05H 7/22; H03M 1/121; G06F 1/04

See application file for complete search history.

(56) References Cited

U.S. PATENT DOCUMENTS

| | | | | |
|---|---|---|---|---|
| 7,595,670 | B2 * | 9/2009 | Hermann | G01R 31/3016 327/147 |
| 9,219,453 | B2 * | 12/2015 | Ahmed | G06F 13/4282 |
| 9,774,299 | B2 * | 9/2017 | Staudinger | H03F 1/0288 |
| 2004/0227106 | A1 * | 11/2004 | Halling | H01J 37/3171 250/492.21 |
| 2005/0045835 | A1 * | 3/2005 | DiVergilio | H01J 37/153 250/492.21 |
| 2007/0164237 | A1 * | 7/2007 | Bernhardt | H01J 37/3172 250/492.21 |

\* cited by examiner

*Primary Examiner* — Raymond R Chai
(74) *Attorney, Agent, or Firm* — Nields, Lemack & Frame, LLC

(57) ABSTRACT

A system for measuring and controlling the phase of an incoming analog waveform is disclosed. The system comprises an analog to digital converter to convert the incoming analog waveform to a digital representation. The system also includes a clock delay generator, which allows a programmable amount of delay to be introduced into the sample clock for the ADC. The system further comprises a controller to manipulate the delay used by the clock delay generator and store the outputs from the ADC. The controller can then use the digitized representation to determine the frequency of the incoming analog waveform, its phase drift and its phase relative to a master clock. The controller can then modify the output of a RF generator in response to these determinations.

20 Claims, 9 Drawing Sheets

DIGITAL SAMPLING TO CONTROL RESONATOR FREQUENCY AND PHASE IN A LINAC

FIELD

Embodiments of the present disclosure relate to systems for digitizing an analog waveform received from a LINAC resonator element, detecting a frequency and phase of that analog waveform and controlling the frequency and phase of that waveform.

BACKGROUND

The fabrication of a semiconductor device involves a plurality of discrete and complex processes. In some of these processes, ions are accelerated toward a workpiece. These ions may be accelerated in a number of ways. For example, electrical fields are commonly used to attract and accelerate positively charged ions.

In certain embodiments, a linear accelerator (or LINAC) may be used to accelerate these ions. In certain embodiments, a LINAC includes a plurality of RF cavities which each serve to further accelerate the ions passing therethrough. The LINAC may operate optimally when each of the RF cavities is energized at its respective resonant frequency.

While LINACs are useful in accelerating ions, there are challenges associated with their use. For example, in certain embodiments, the cavities may be energized with a fixed temporal relationship to one another in order to maximize the effect of each respective resonator. However, creating and maintain this temporal relationship may be difficult.

Consequently, monitoring the voltages being applied to each cavity of the LINAC and the resulting resonance output may be advantageous. Further, the ability to monitor the phase of the input voltage over time may help maximize the performance of the LINAC. However, monitoring the phase of these signals may be difficult.

Therefore, it would be advantageous if there were a system that is capable of digitally measuring the phase and frequency of the analog voltages and/or currents associated with each cavity of the LINAC. It would be beneficial if this system was able to achieve sub-nanosecond resolution using traditional analog to digital converters.

SUMMARY

A system for measuring and controlling the phase of an incoming analog waveform is disclosed. The system comprises an analog to digital converter to convert the incoming analog waveform to a digital representation. The system also includes a clock delay generator, which allows a programmable amount of delay to be introduced into the sample clock for the ADC. The system further comprises a controller to manipulate the delay used by the clock delay generator and store the outputs from the ADC. The controller can then use the digitized representation to determine the frequency of the incoming analog waveform, its phase drift and its phase relative to a master clock. The controller can then modify the output of a RF generator in response to these determinations.

According to one embodiment, an ion implantation system is disclosed. The ion implantation system comprises an ion source to generate ions; a linear accelerator to accelerate the ions toward a workpiece, wherein the linear accelerator comprises one or more cavities; a pickup loop disposed proximate one of the cavities; an analog to digital converter (ADC) comprising: an input comprising an incoming analog waveform created from the pickup loop; an output; and a sample clock; a clock delay generator, comprising: an input clock; a control input to determine an amount of delay; and an output that comprises the sample clock for the ADC; and a controller, comprising a processing unit and a memory device; wherein the controller: stores the output from the ADC; adjusts the amount of delay used by the clock delay generator; and repeatedly stores the output and adjusts the amount of delay until a digitized representation of the incoming analog waveform is created in the memory device. In certain embodiments, a resolution of the digitized representation is less than one nanosecond. In some embodiments, a maximum sample rate of the ADC is less than the resolution of the digitized representation. In certain embodiments, the ion implantation system further comprises a second ADC comprising: an input comprising an incoming analog waveform created from the pickup loop; an output; and a second sample clock, wherein a phase of the second sample clock is different from the sample clock. In certain embodiments, the ion implantation system comprises a RF generator, wherein the controller modifies the output of the RF generator based on the digitized representation. In certain embodiments, the controller uses the digitized representation to determine phase drift of the incoming analog waveform and adjusts a frequency or amplitude of the RF generator to correct the phase drift. In certain embodiments, the controller measures a phase delay between a master clock and the incoming analog waveform and adjusts a frequency or amplitude of the RF generator to achieve a desired phase delay. In certain embodiments, the ion implantation system comprises a global controller, and the digitized representation is transmitted to the global controller for analysis.

According to another embodiment, an ion implantation system is disclosed. The ion implantation system comprises an ion source to generate ions; a linear accelerator to accelerate the ions toward a workpiece, wherein the linear accelerator comprises one or more cavities; a RF generator to supply an electrical signal to excite an excitation coil in one of the one or more cavities; an analog to digital converter (ADC) comprising: an input comprising an analog excitation voltage representative of the electrical signal supplied to the excitation coil; an output; and a sample clock; a clock delay generator, comprising: an input clock; a control input to determine an amount of delay; and an output that comprises the sample clock for the ADC; and a controller, comprising a processing unit and a memory device; wherein the controller: stores the output from the ADC; adjusts the amount of delay used by the clock delay generator; and repeatedly stores the output and adjusts the amount of delay until a digitized representation of the analog excitation voltage is created in the memory device. In certain embodiments, the controller uses the digitized representation to determine phase drift of the analog excitation voltage and adjusts a frequency or amplitude of the RF generator to correct the phase drift. In some embodiments, the controller measures a phase delay between a master clock and the digitized representation and adjusts a frequency or amplitude of the RF generator to achieve a desired phase delay. In some embodiments, the resolution of the digitized representation is less than one nanosecond. In certain embodiments, the maximum sample rate of the ADC is less than the resolution of the digitized representation.

According to another embodiment, an ion implantation system is disclosed. The ion implantation system comprises an ion source to generate ions; a linear accelerator to accelerate the ions toward a workpiece, wherein the linear accelerator comprises one or more cavities; a RF generator to supply an electrical signal to excite an excitation coil in one of the one or more cavities; a pickup loop disposed proximate one of the cavities; an analog to digital converter (ADC) comprising: an input comprising an incoming analog waveform; an output; and a sample clock; a clock delay generator, comprising: an input clock; a control input to determine an amount of delay; and an output that comprises the sample clock for the ADC; and a controller, comprising a processing unit and a memory device. In certain embodiments, the ion implantation system comprises an analog multiplexer, having an output in communication with the input of the ADC, and having two inputs, a first input comprising an incoming analog waveform created from the pickup loop, and a second input comprising an analog excitation voltage representative of the electrical signal supplied to the excitation coil. In certain embodiments, the ion implantation system comprises a second analog to digital converter (ADC) comprising: an input comprising an analog excitation voltage representative of the electrical signal supplied to the excitation coil; an output; and a sample clock; a second clock delay generator, comprising: an input clock; a control input to determine an amount of delay; and an output that comprises the sample clock for the second ADC; wherein the output of the second ADC comprises an input to the controller, and wherein the input to the ADC comprises an incoming analog waveform created from the pickup loop. In certain embodiments, the controller: stores the outputs from the ADC and the second ADC; adjusts the amount of delay used by the clock delay generator and the second clock delay generator; and repeatedly stores the outputs and adjusts the amount of delay until digitized representations of the incoming analog waveform and the analog excitation voltage are created in the memory device. In certain embodiments, the controller uses the digitized representations to determine phase difference between the incoming analog waveform and the analog excitation voltage, and adjusts a frequency or amplitude of the RF generator based the phase difference. In certain embodiments, the resolution of the digitized representations is less than one nanosecond. In certain embodiments, the maximum sample rate of the ADC and the second ADC is less than the resolution of the digitized representations.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
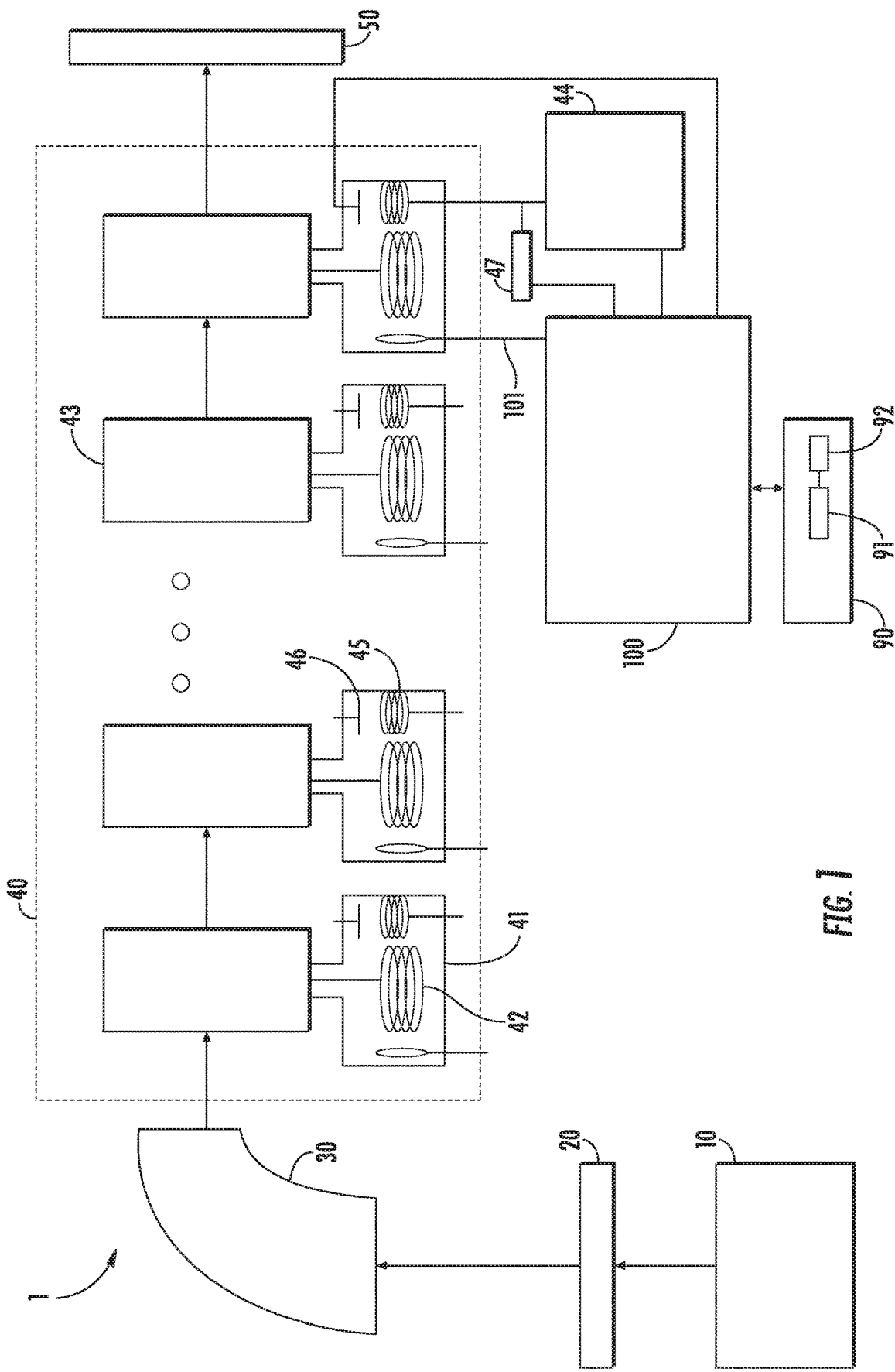
FIG. 1 shows a block diagram of the ion implantation system utilizing a linear accelerator, or LINAC, according to one embodiment.

As described above, linear accelerators may be used to accelerate ions toward a workpiece. FIG. 1 shows an ion implantation system 1. The ion implantation system 1 comprises an ion source 10. The ion source 10 may be any suitable ion source, such as, but not limited to, an indirectly heated cathode (IHC) source, a Bernas source, a capacitively coupled plasma source, an inductively coupled plasma source, or any other suitable device. The ion source 10 has an aperture through which ions may be extracted from the ion source 10. These ions may be extracted from the ion source 10 by applying a negative voltage to one or more electrodes 20, disposed outside the ion source 10, proximate the extraction aperture. The electrodes 20 may be pulsed so that ions exit at specific times. The group of ions that exits may be referred to as a bunch.

The ions may then enter a mass analyzer 30, which may be a magnet that allows ions having a particular mass to charge ratio to pass through. This mass analyzer 30 is used to separate only the desired ions. It is the desired ions that then enter the linear accelerator 40.

The linear accelerator 40 comprises one or more cavities 41. Each cavity 41 comprises a resonator coil 42 that may be energized by electromagnetic fields created by an excitation coil 45. The excitation coil 45 is disposed in the cavity 41 with a respective resonator coil 42. The excitation coil 45 is energized by an excitation voltage, which may be a RF signal. The excitation voltage may be supplied by a respective RF generator 44. In other words, the excitation voltage applied to each excitation coil 45 may be independent of the excitation voltage supplied to any other excitation coil 45. Each excitation voltage is preferably modulated at the resonance frequency of its respective cavity 41. The magnitude and phase of the excitation voltage may be determined and changed by the monitoring and control circuit 100, which is in communication with the RF generator 44. By disposing the resonator coil 42 in a cavity 41, the magnitude of the excitation voltage may be increased or phase shifted while keeping the amplitude the same.

Within each cavity 41, there may be a respective tuner paddle 46. The tuner paddle 46 may be in communication with an actuator so as to modify its position within the cavity 41. The position of the tuner paddle 46 may affect the resonant frequency of the cavity 41. The actuator may be controlled by the monitoring and control circuit 100.

When an excitation voltage is applied to the excitation coil 45, a voltage is induced on the resonator coil 42. The result is that the resonator coil 42 in each cavity 41 is driven by a sinusoidal voltage. Each resonator coil 42 may be in electrical communication with a respective accelerator electrode 43. The ions pass through apertures in each accelerator electrode 43.

The entry of the bunch into a particular accelerator electrode 43 is timed such that the potential of the accelerator electrode 43 is negative as the bunch approaches, but switches to positive as the bunch passes through the accelerator electrode 43. In this way, the bunch is accelerated as it enters the accelerator electrode 43 and is repelled as it exits. This results in an acceleration of the bunch. This process is repeated for each accelerator electrode 43 in the linear accelerator 40. Each accelerator electrode increases the acceleration of the ions and can be measured.

After the bunch exits the linear accelerator 40, it is implanted into the workpiece 50.

Of course, the ion implantation system 1 may include other components, such as an electrostatic scanner to create a ribbon beam, quadrupole elements, additional electrodes to accelerate or decelerate the beam and other elements.

In certain embodiments, the ion implantation system 1 also includes a monitoring and control circuit 100. In certain embodiments, there is a separate monitoring and control circuit 100 for each cavity 41. FIG. 1 shows only a single monitoring and control circuit 100. However, these components may be replicated for each cavity 41. For example, each cavity 41 may be associated with a respective RF generator 44 and a monitoring and control circuit 100.

Each excitation coil 45 is tuned to a single resonant frequency. This is achieved using the RF generator 44 and manipulating the tuner paddle 46.

The monitoring and control circuit 100 includes a pickup loop 101 that is disposed proximate or within one of the cavities 41. A sinusoidal voltage is induced on the pickup loop 101 by the electromagnetic fields near or within the cavity 41. The pickup loop 101 may be simply a looped wire or a printed circuit board.

In certain embodiments, a current to voltage converter 47 is used to convert the current supplied by the RF generator 44 to the excitation coil 45 into a voltage.

A global controller 90 is also shown. The global controller 90 may be in communication with a plurality of monitoring and control circuits 100. The global controller 90 may create a master clock that is used by the rest of the ion implantation system 1. The global controller 90 may include a processing unit 91 and a memory device 92. The processing unit 91 may be a microprocessor, a signal processor, a customized field programmable gate array (FPGA), or another suitable unit. This memory device 92 may be a non-volatile memory, such as a FLASH ROM, an electrically erasable ROM or other suitable devices. In other embodiments, the memory device 92 may be a volatile memory, such as a RAM or DRAM. The memory device 92 comprises instructions that enable the global controller 90 to perform the tasks described herein.

Figure 2:
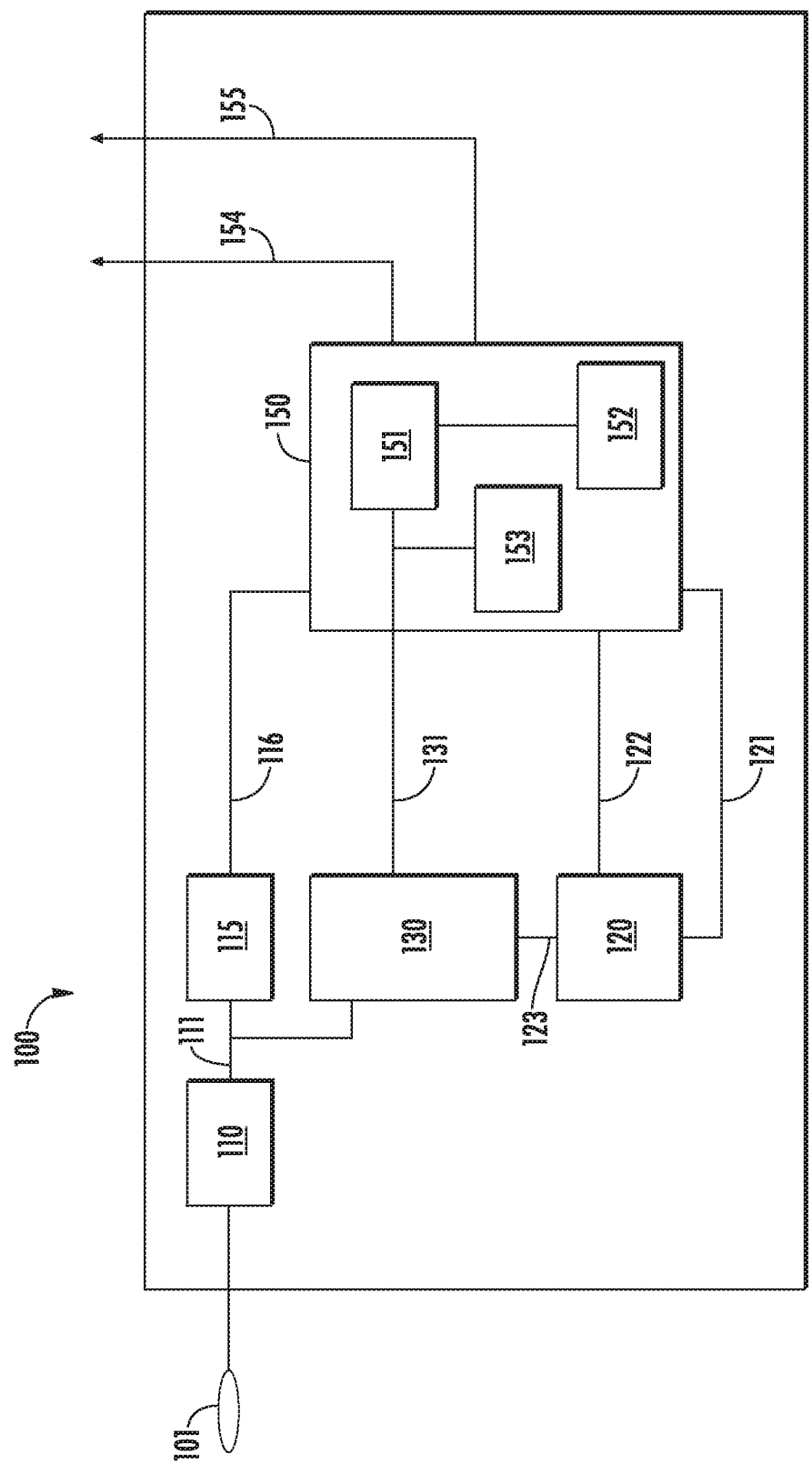
FIG. 2 shows the monitoring and control circuit according to one embodiment.

FIG. 2 shows a first embodiment of the monitoring and control circuit 100.

The monitoring and control circuit 100 includes a pre-amplifier 110. The pre-amplifier 110 is used to amplify the sinusoidal signal induced on the pickup loop 101. For example, the output 111 of the pre-amplifier 110 may be a voltage between 0-10 volts or between +/−5 volts. In other embodiments, the output 111 of the pre-amplifier 110 may have a different range of voltages. This output 111 may be referred to as the incoming analog waveform.

The output 111 of the pre-amplifier 110 may serve as an input to an analog-to-digital converter (ADC) 130. The ADC 130 samples the incoming analog waveform received from the pre-amplifier 110 and generates a digital representation of that analog waveform. The digital representation may be an 8, 12 or bit representation in certain embodiments. The ADC 130 samples the analog waveform based on an output 123 from the clock delay generator 120.

Additionally, the output 111 of the pre-amplifier 110 may serve as an input to a zero-crossing detector 115. The zero-crossing detector 115 may be constructed using op-amps, opto-couplers, or any other suitable method. The zero-crossing detector 115 creates an output 116 having a transition each time the incoming analog waveform crosses zero volts, in either the positive or negative direction.

Additionally, the monitoring and control circuit 100 includes a controller 150. The controller 150 may comprise a processing unit 151 and an associated memory device 152. This memory device 152 contains the instructions, which, when executed by the processing unit 151, enable the controller 150 to perform the functions described herein. The processing unit 151 may be a microprocessor, a signal processor, a customized field programmable gate array (FPGA), or another suitable unit. This memory device 152 may be a non-volatile memory, such as a FLASH ROM, an electrically erasable ROM or other suitable devices. In other embodiments, the memory device 152 may be a volatile memory, such as a RAM or DRAM. The controller 150 may comprise a second memory device 153 to store data received from the ADC 130, and other associated circuitry.

For example, in one embodiment, the clock signal 121 to the clock delay generator 120 may be a master clock. This master clock may have a known relationship to the incoming analog waveform. For example, the frequency of the master clock may be a multiple of the frequency of the incoming analog waveform, such as 2, 4 or another multiple. In other embodiments, there may be N periods of the master clock for each period of the incoming analog waveform. The master clock may have a frequency between 25 MHz and 200 MHz, depending on the implementation.

The controller 150 also provides one or more control signals 122 to the clock delay generator 120 that indicate an amount of delay that the clock delay generator 120 is to add to the clock signal 121. The clock delay generator 120 may be a digitally controlled delay line, where the control signals 122 are used to indicate the amount of delay to be added. For example, the plurality of control signals 122 may form a multi-bit binary value, where that value is indicative of the delay. In other embodiments, there may be one control signal which transmits a serial data stream to the clock delay generator 120.

As stated, the clock signal 121 to the clock delay generator 120 may be the master clock. The control signals 122 are supplied by the controller 150 and represent the amount of delay to be added to the input signal. Finally, the output 123 from the clock delay generator 120 is the clock signal 121, delayed by the amount specified by the controller 150.

In addition to providing the control signals 122 to the clock delay generator 120, the controller 150 also receives the output 131 from the ADC 130. This output 131 may be stored in the second memory device 153 and are used to create a digitized version of the incoming analog waveform with sub-nanosecond resolution, as described in more detail below.

Finally, the controller 150 may also provide an output 154 that is used to control the RF generator 44. Optionally, the controller 150 may also have a second output 155 that is used to control the tuner paddle 46. The digitized version of the incoming analog waveform may also be retrieved by the global controller 90, if desired. The global controller 90 may analyze the digitized version for anomalies, such as glitches.

Figure 3:
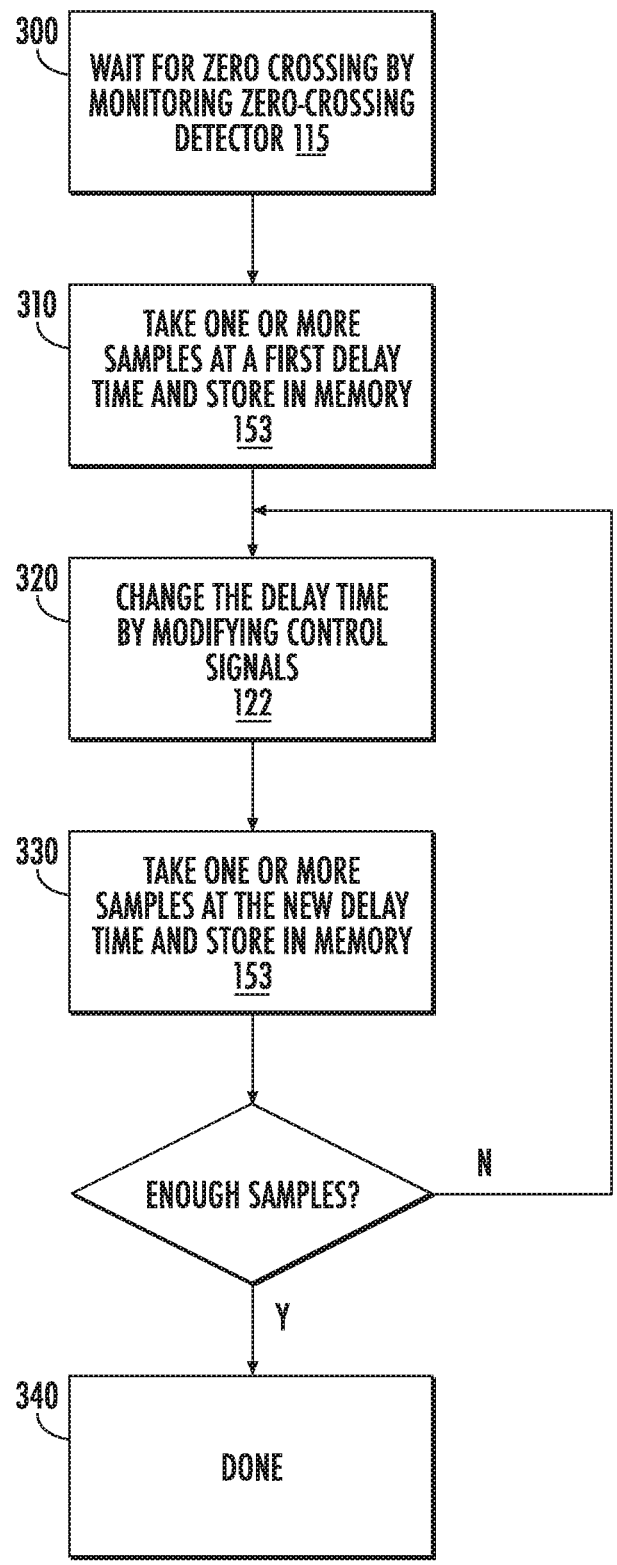
FIG. 3 shows a sequence to create a digitized waveform having sub-nanosecond resolution.

The controller 150 assumes that the incoming analog waveform from the pickup loop 101 is periodic. Thus, rather than attempting to capture an entirety of the waveform during one period, the controller 150 captures the waveform over a plurality of periods. This process is shown in FIG. 3 and the results are shown in FIGS. 4A-4F.

For example, assume that the input signal to the clock delay generator 120 is a master clock having a frequency that is N times greater than the frequency of the incoming analog waveform. Thus, it is possible to obtain N samples of the incoming analog waveform each period. Also assume that the delay added by the clock delay generator 120 is a multiple of a minimum delay time, or Td. The controller 150 waits until an indication of the zero-crossing from the zero-crossing detector 115, as shown in Box 300. This is used to indicate the start of a collection period. During a collection period, the controller 150 will collect a sufficient number of digitized samples to reconstruct the incoming analog waveform. For example, if the incoming analog waveform has a frequency of 25 MHz, then 100 samples, spaced 0.4 nanoseconds apart, may be used to recreate the incoming analog waveform. Thus, the digitized waveform has a resolution that is smaller than the minimum sample time of the ADC 130.

Furthermore, the sample time can be further reduced. In one embodiment, two or more ADCs are used to obtain digitized samples. These two or more ADCs may operate with different delays to capture different values of the incoming analog waveform. In another words, the phase of the sample clock supplied to the second ADC is different from the phase of the sample clock supplied to the ADC 130. In another embodiment, both transitions of the master clock may be used to double the sample rate of the ADC 130. This may be achieved using one ADC or utilizing a second ADC, which samples on the opposite transition from the ADC 130. These approaches may be used to increase the resolution of the digitized representation, reduce the time to create the digitized representation, or both.

Initially, the controller 150 may set the control signals 122 to a first delay time. This first delay time may represent the minimum allowable delay, or 1×Td. In other embodiments, a different first delay time may be used.

Figure 4A:
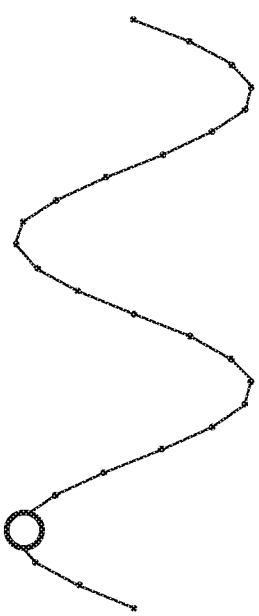
FIG. 4A-4F show the creation of a digitized waveform using the sequence of FIG. 3.

The ADC 130 will therefore provide a digital representation of the incoming analog waveform at time equal to the first delay time, which may be 1×Td. A first sample taken at this time is shown in FIG. 4A. The controller 150 may receive a plurality of samples using this first delay time, as shown in Box 310. For example, the controller 150 may receive N samples using this delay. In this embodiment, the controller 150 will receive N samples, with values:

Sample($n$)=sin($F*2*\eta*n/N$+(1×$Td$)+φ), wherein F is the frequency of the incoming analog waveform, n is the number of the sample, 1×Td is the delay indicated by control signals 122, and φ is the phase difference between the master clock and the zero crossing.

At a later time, which may also be synchronized to a zero crossing, the controller 150 may then change the control signals 122 to provide a different delay, such as 2×Td, as shown in Box 320.

Thus, the ADC 130 will then obtain a digital value representation of the incoming analog waveform at time equal to $F*2*\pi*n/N+(2\times Td)+\varphi$.

Figure 4C:
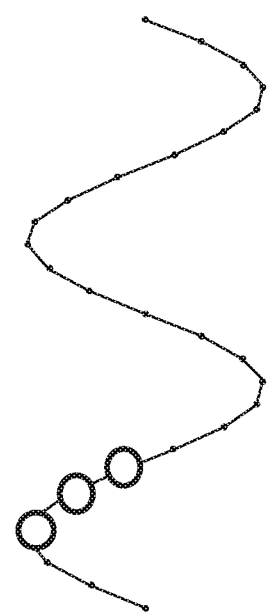
Figure 4E:
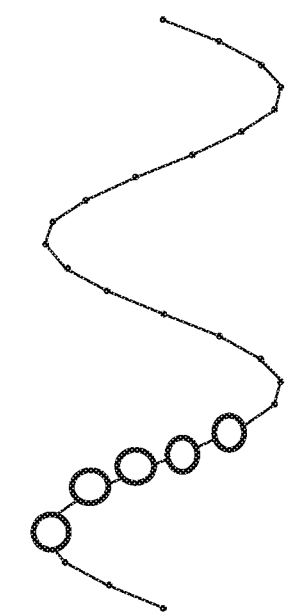
Figure 4B:
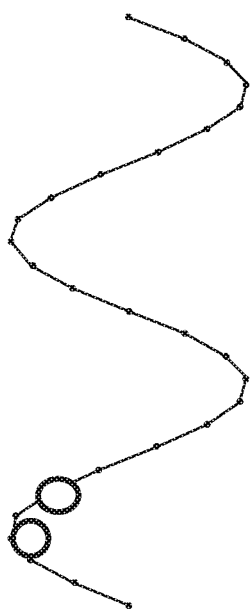

If master clock is a multiple of the frequency of the input analog waveform, a particular sample (sample(n)) will be offset from sample (n−N) by exactly the difference in the two delay times. In other words, in this example, sample (n) is offset from sample(n−N) by a phase of 1×Td. Thus, the samples taken with the second delay will be temporally near the previous samples, as shown in FIG. 4B. In this example, the controller 150 may receive N samples using this delay, as shown in Box 330.

Figure 4D:
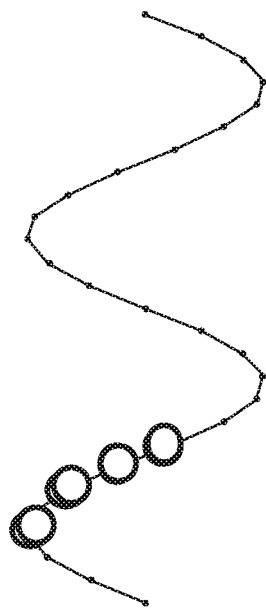

Thus, rather than using the absolute time, the controller 150 creates a waveform using the relative time (i.e. modulo $F*2*\pi$). FIG. 4C-4E shows how the controller 150 continues to reconstruct the incoming analog waveform at delays equal to 3×Td, 4×Td and 5×Td, respectively. Once enough samples have been collected, the collection period is done, as shown in Box 340.

Figure 4F:
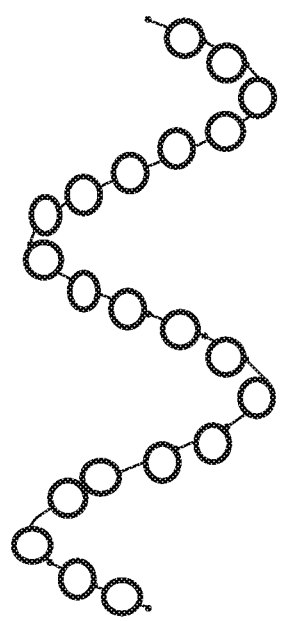

In this manner, a digital version of the incoming analog waveform can be created with sub-nanosecond resolution, as shown in FIG. 4F.

Further, while FIGS. 4A-4E show only one sample being added for each delay time, it is understood that more than one sample may be added if the master clock is at a higher frequency than the input analog waveform.

For example, assume that the frequency of the incoming analog waveform is 25 MHz and the master clock is 100 MHz, so that N=4. Assume that the phase difference between the master clock is given by φ. Also assume that the minimum time delay is 0.5 ns. Thus, after the zero-crossing, the controller 150 will capture 4 samples:

Sample($n$)=sin($F*2*\pi*n/N$+(1*$Td$)+φ), which reduces to sin($2*\pi*n/4$+0.5 ns+φ).

Thus, the first 4 samples may be given as:

Sample(1)=sin($\eta/2$+0.5 ns+φ);

Sample(2)=sin($\eta$+0.5 ns+φ);

Sample(3)=sin($3\eta/2$+0.5 ns+φ); and

Sample(4)=sin($2\eta$+0.5 ns+φ).

The delay is then changed to 2*Td, or 1.0 ns. Thus, the next four samples may be given as Sample(5)=sin($\eta/2$+1.0 ns+φ);

Sample(6)=sin($\eta$+1.0 ns+φ);

Sample(7)=sin($3\eta/2$+1.0 ns+φ); and

Sample(8)=sin($2\eta$+1.0 ns+φ).

This continues until the delay reaches π/2, at which point all of the points in the waveform will be filled in.

The controller 150 may store each of these digital values in the second memory 153. In certain embodiments, the digital values are stored in locations at addresses that are indicative of their time during the waveform. In this way, the digitized samples may be stored in temporal order.

Further, in certain embodiments, the clock delay generator 120 may be capable of introducing a delay that is at least as large as the period of the incoming analog waveform, divided by N.

Thus, assuming that the master clock operates at a frequency that is 4 times greater than the frequency of the incoming analog waveform, the controller 150 may be able to generate a digitized waveform having 100 samples in as little as periods of the incoming analog waveform. If the incoming analog waveform has a frequency of 12.5 MHz, this implies that the samples are separated by about 0.8 nanoseconds. If 200 samples are used to create the digitized waveform, the samples may be separated by 0.4 nanoseconds.

Thus, the digitized samples very accurately represent the incoming analog waveform, with sub-nanosecond resolution.

This digitized waveform may be used in a number of ways. First, the digitized waveform provides a very accurate determination of the period of the incoming analog waveform. Thus, if the period of the incoming analog waveform is not what is expected, the controller 150 may manipulate output 154 to change the frequency of the RF generator 44. The controller 150 may then repeat the process described above again to determine the new period of the incoming analog waveform.

Figure 5:
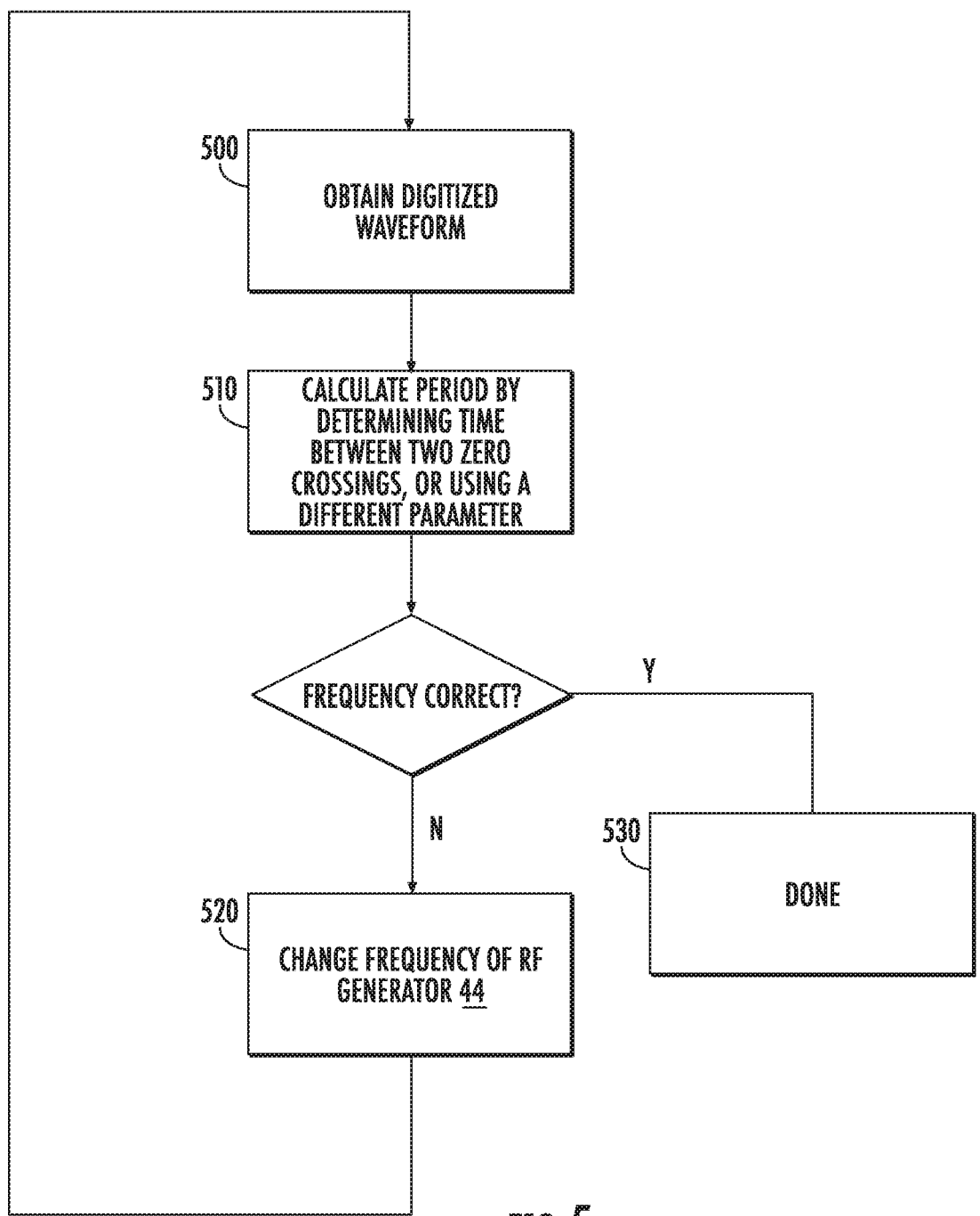
FIG. 5 shows a sequence to determine and control the frequency of the resonator coil.

Thus, in one embodiment, the digitized waveform is used to verify the frequency of the incoming analog waveform. The sequence is shown in FIG. 5. First, as shown in Box 500, a digitized waveform is collected, such as using the sequence shown in FIG. 3. Next, the period of the digitized waveform is determined, as shown in Box 510. This may be done by counting the number of samples between two zero crossings, the number of samples between two peaks, or using another parameter. The number of samples is then converted to a time or frequency based on the frequency of the master clock. The controller 150 may then determine whether the frequency is correct. If the frequency is correct, there is no further action and the process is done, as shown Box 530. However, if the frequency is incorrect, the controller 150 may manipulate the output 154 so as to change the frequency of the RF generator 44. After a settling time, the controller 150 then repeats this process until the frequency is correct.

Figure 6:
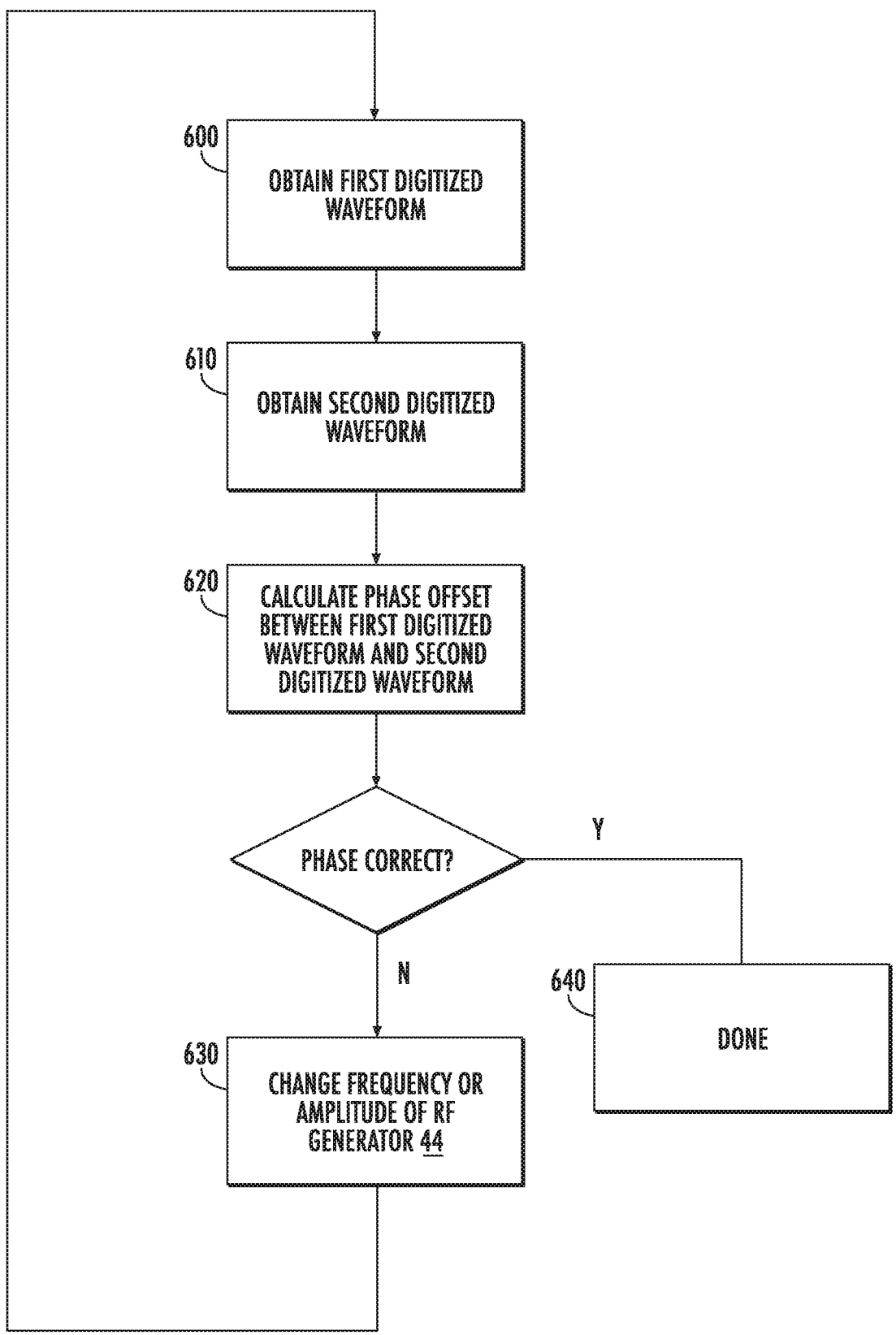
FIG. 6 shows a sequence to determine and control the phase of the resonator coil.
Figure 7A:
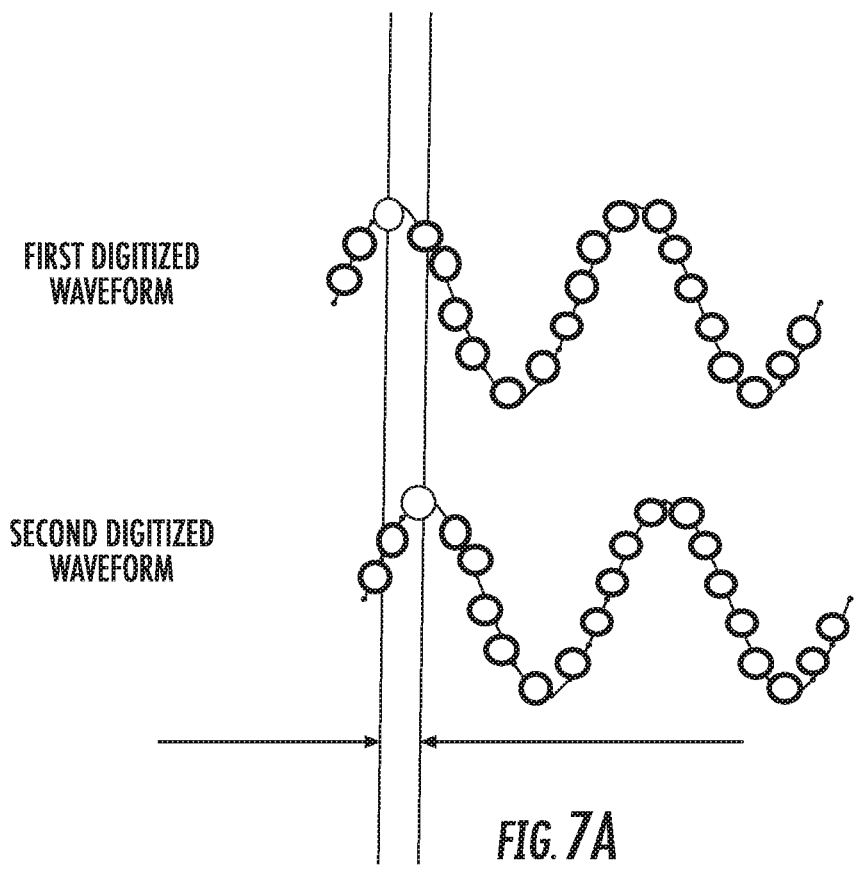
FIG. 7A-7B show the results of the sequence of FIG. 6 in two different scenarios.
Figure 7B:
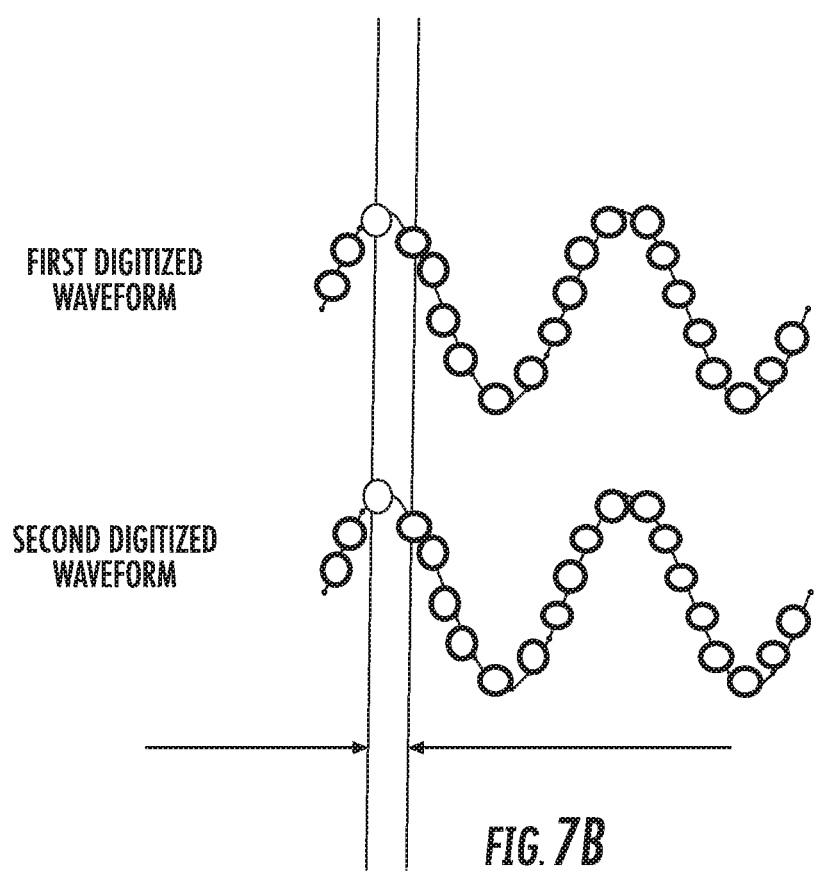

Additionally, the controller 150 may use the digitized samples to detect small phase shifts or drift. FIG. 6 shows the sequence used by the controller 150 to determine the phase shift of the incoming analog waveform. First, as shown in Box 600, the controller 150 may obtain a first digitized waveform, as explained in FIG. 3. Then, the controller 150 may wait a predetermined time. The controller 150 then obtains a second digitized waveform, as shown in Box 610. The controller 150 then calculates the phase difference between these two digitized waveforms, as shown in Box 620. For example, if the frequency of the incoming analog waveform is exactly equal to 1/N of the master clock, then both digitized waveforms will be identical, allowing for noise. However, if the frequency of the incoming analog waveform is not exactly equal to 1/N of the master clock, then the starting phase of the first digitized sample and the second digitized sample will differ. Further, the peaks and zero crossing of the first digitized waveform will not be in the same positions as the peaks and zero crossing of the second digitized waveform. In one embodiment, the controller 150 determines the offset between the two digitized waveforms as a function of number of samples. The difference in the number of samples, multiplied by the period of the master clock is an indication of the phase difference between the two digitized waveforms. If the phases match, as shown in FIG. 7B, no further action is taken and the sequence is complete, as shown in Box 640. If the phases do not match, as is shown in FIG. 7A, the controller 150 may change the frequency or amplitude of the RF generator 44, as shown in Box 630. After a settling time, the controller 150 then repeats this process until the frequency is correct.

Additionally, the controller 150 may also regulate the phase of the incoming analog waveform relative to the master clock. As noted above, the entry of the bunch into a particular accelerator electrode 43 is timed such that the potential of the accelerator electrode 43 is negative as the bunch approaches, but switches to positive as the bunch passes through the accelerator electrode 43. In this way, the bunch is accelerated as it enters the accelerator electrode 43 and is repelled as it exits. In order to maximize this effect, the phases of each accelerator electrode 43 need to be properly correlated.

Thus, the controller 150 may utilize the digitized waveform to determine the phase of the induced voltage. For example, the digitized waveform may be compared to a master clock signal to determine phase.

Stated differently, after a zero-crossing, the controller 150 collects a digitized waveform by varying the delay time to the clock delay generator 120. However, the beginning of that digitized waveform reflects the value of the incoming analog waveform with a minimum delay time. This value may then be used to determine the phase of the digitized representation at that time. Knowing the frequency and amplitude of the incoming analog waveform, one can readily find the phase of any point in the digitized representation as phase=$\sin^{-1}$(value/A), where value is the value of the digitized waveform and A is the maximum amplitude. This phase can be converted to an absolute time delay based on the frequency of the incoming analog waveform. Alternatively, the number of samples until the next zero crossing can also be used to determine the phase delay (or phase lead) between the master clock and the incoming analog waveform.

Each controller 150 may be instructed by a global controller 90 of the desired phase. The controller 150 then attempts to achieve this phase. For example, the controller 150 may adjust the frequency of the RF generator 44. In another embodiment, the controller 200 may modify the position of the tuner paddle 46 in the cavity 41 to adjust the desired phase of the induced voltage.

While the above description describes the operation of the monitoring and control circuit 100 with respect to the incoming analog waveform received from the pickup loop 101, additional features are also possible.

For example, the monitoring and control circuit 100 may also monitor the excitation current being delivered to the excitation coil 45. First, as described above, the current is converted to a voltage using the current to voltage converter 47. The analog excitation voltage is then provided as an input to the monitoring and control circuit 100. The analog excitation voltage may then be digitized in the same manner as described above with respect to the analog waveform from the pickup loop 101. This may be achieved in variety ways.

Figure 8:
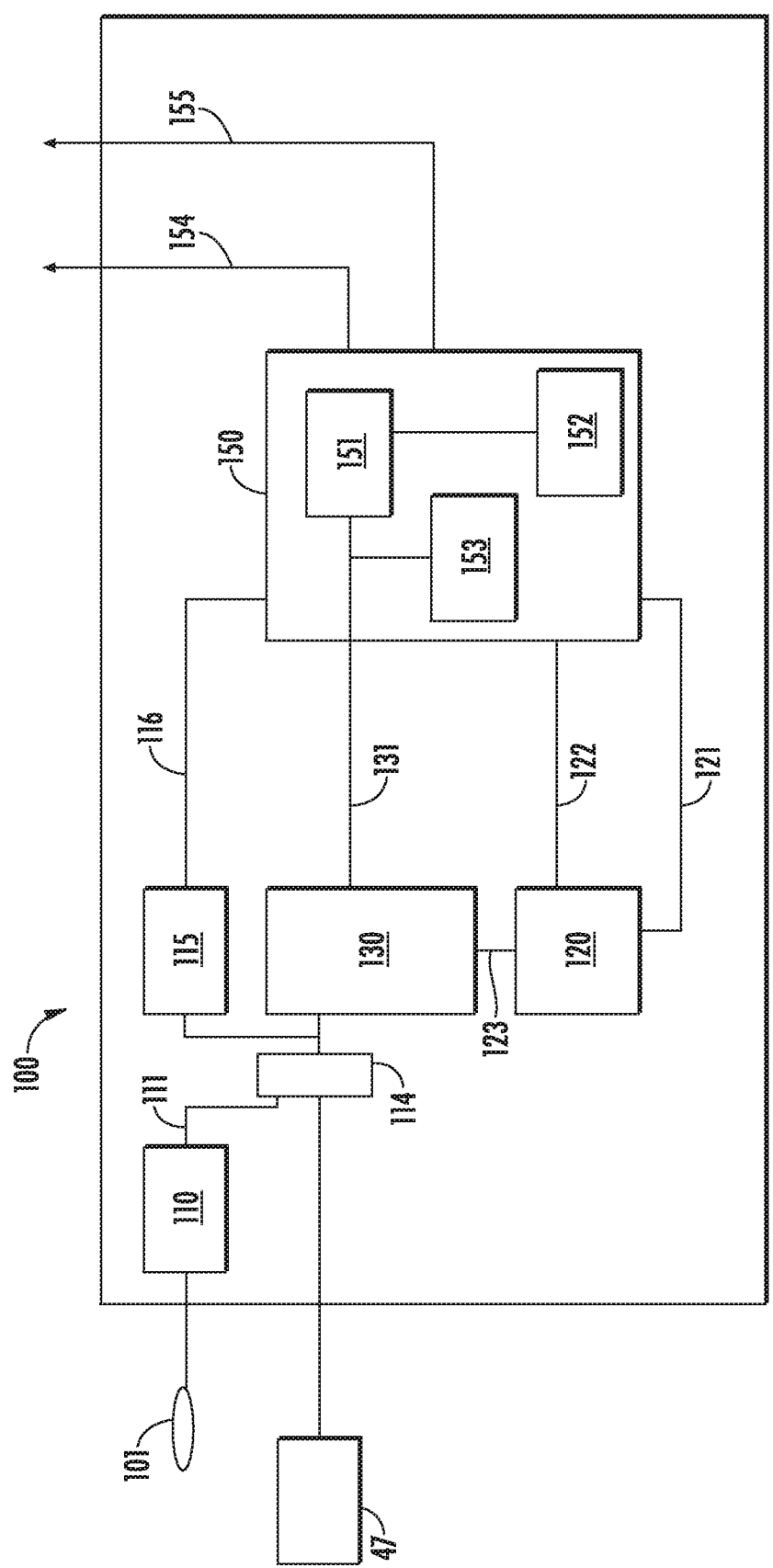
FIG. 8 shows the monitoring and control circuit according to a second embodiment.

First, as shown in FIG. 8, an analog multiplexer 114 may be used to select between the incoming analog waveform from the pickup loop 101 and the analog excitation voltage from the current to voltage converter 47. Thus, the controller 150 may select one of the two inputs by manipulating a select input to the analog multiplexer 114. The controller 150 can then generate digitized representations for both of these analog waveforms by manipulating the analog multiplexer 114.

Figure 9:
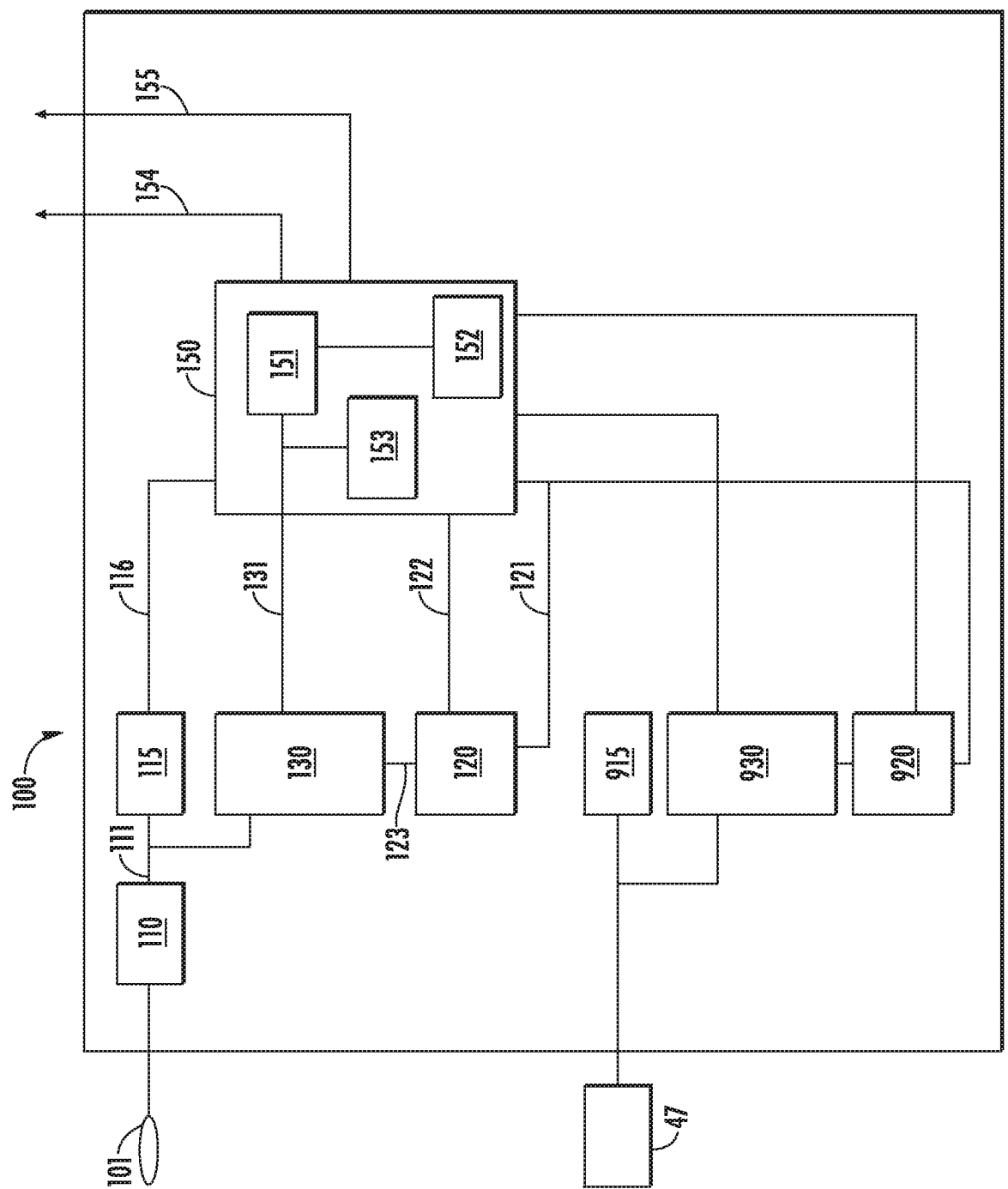
FIG. 9 shows the monitoring and control circuit according to a third embodiment.

Alternatively, as shown in FIG. 9, a second ADC 930, a second clock delay generator 920 and a second zero-crossing detector 915 may be included to allow the monitoring and control circuit 100 to digitize the analog excitation voltage. This digitization may be done in the same manner as was described above.

The digitized excitation voltage may be used to find the frequency of the RF generator 44, and to determine the phase of the analog excitation voltage with respect to the master clock. The frequency and phase information may be obtained using the algorithms described above with respect to FIGS. 5 and 6.

Additionally, the controller 150 may also compare the incoming analog waveform from the pickup loop 101 with the analog excitation voltage. For example, the phase difference between the analog excitation voltage and the incoming analog waveform from the pickup loop 101 may be determined using the techniques described above. In one embodiment, the phase difference between these two waveforms is calculated by determining the phase difference of each signal with respect to the master clock. In another embodiment, the phase difference between these two waveforms is calculated by comparing the two digitized representations. This phase difference may be used to control the amplitude and/or frequency of the RF generator 44.

The above disclosure describes normal operation. However, other factors may also be considered. For example, the digitized waveform may indicate that a glitch occurred. In the event of a glitch, the controller 150 may provide information to the global controller 90. The global controller 90 may instruct the controller 150 to recalibrate the resonant cavity 41 or take some other action.

Additionally, temperature variation, cavity vacuum, and vibration may affect the natural resonant frequency of the cavity 41. The controller 150 may continuously monitor the frequency and phase of the incoming analog waveform. A change in phase or frequency in its maximum amplitude may be indicative of a drift in the natural resonant frequency. The controller 150 may initiate a corrective action. For example, in one embodiment, the controller 150 may move the tuner paddle 46 in the cavity 41 to reacquire the resonant frequency. The controller 150 may report any change in the resonant frequency to the global controller 90. The global controller 90 may then instruct the controller 200 to take some corrective action.

The present system has many advantages. The ability to monitor an incoming analog signal, with sub-nanosecond resolution, allows a digital controller to make various decisions and take various corrective actions. Previously, the phase may be determined using analog circuitry, which had to be calibrated and recalibrated, reducing its accuracy. Further, this approach allows one or more periods of the incoming analog waveform to be captured and analyzed for anomalies, such as glitches. The sub-nanosecond resolution also allows phase drift that is less than 1 nanosecond to be observed by the controller. Thus, the accuracy and efficiency of the LINAC may be improved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:
an ion source to generate ions;
a linear accelerator to accelerate the ions toward a workpiece, wherein the linear accelerator comprises one or more cavities;
a pickup loop disposed proximate one of the cavities;
an analog to digital converter (ADC) comprising: an input comprising an incoming analog waveform created from the pickup loop; an output; and a sample clock;
a clock delay generator, comprising: an input clock; a control input to determine an amount of delay; and an output that comprises the sample clock for the ADC;
and a controller, comprising a processing unit and a memory device;
wherein the controller:
stores the output from the ADC; adjusts the amount of delay used by the clock delay generator; and
repeatedly stores the output and adjusts the amount of delay until a digitized representation of the incoming analog waveform is created in the memory device.

2. The ion implantation system of claim 1, wherein a resolution of the digitized representation is less than one nanosecond.

3. The ion implantation system of claim 2, wherein a maximum sample rate of the ADC is less than the resolution of the digitized representation.

4. The ion implantation system of claim 1, further comprising a second ADC comprising: an input comprising an incoming analog waveform created from the pickup loop; an output; and a second sample clock, wherein a phase of the second sample clock is different from the sample clock.

5. The ion implantation system of claim 1, further comprising a RF generator, wherein the controller modifies the output of the RF generator based on the digitized representation.

6. The ion implantation system of claim 5, wherein the controller uses the digitized representation to determine phase drift of the incoming analog waveform and adjusts a frequency or amplitude of the RF generator to correct the phase drift.

7. The ion implantation system of claim 5, wherein the controller measures a phase delay between a master clock and the incoming analog waveform and adjusts a frequency or amplitude of the RF generator to achieve a desired phase delay.

8. The ion implantation system of claim 1, further comprising a global controller, and wherein the digitized representation is transmitted to the global controller for analysis.

9. An ion implantation system, comprising:
an ion source to generate ions;
a linear accelerator to accelerate the ions toward a workpiece, wherein the linear accelerator comprises one or more cavities;
a RF generator to supply an electrical signal to excite an excitation coil in one of the one or more cavities;
an analog to digital converter (ADC) comprising: an input comprising an analog excitation voltage representative of the electrical signal supplied to the excitation coil; an output;
and a sample clock;
a clock delay generator, comprising: an input clock; a control input to determine an amount of delay; and an output that comprises the sample clock for the ADC; and
a controller, comprising a processing unit and a memory device;
wherein the controller:
stores the output from the ADC;
adjusts the amount of delay used by the clock delay generator; and repeatedly stores the output and adjusts the amount of delay until a digitized representation of the analog excitation voltage is created in the memory device.

10. The ion implantation system of claim 9, wherein the controller uses the digitized representation to determine phase drift of the analog excitation voltage and adjusts a frequency or amplitude of the RF generator to correct the phase drift.

11. The ion implantation system of claim 9, wherein the controller measures a phase delay between a master clock and the digitized representation and adjusts a frequency or amplitude of the RF generator to achieve a desired phase delay.

12. The ion implantation system of claim 9, wherein a resolution of the digitized representation is less than one nanosecond.

13. The ion implantation system of claim 12, wherein a maximum sample rate of the ADC is less than the resolution of the digitized representation.

14. An ion implantation system, comprising:
   an ion source to generate ions;
   a linear accelerator to accelerate the ions toward a workpiece, wherein the linear accelerator comprises one or more cavities;
   a RF generator to supply an electrical signal to excite an excitation coil in one of the one or more cavities;
   a pickup loop disposed proximate one of the cavities;
   an analog to digital converter (ADC) comprising: an input comprising an incoming analog waveform; an output; and a sample clock;
   a clock delay generator, comprising: an input clock; a control input to determine an amount of delay; and an output that comprises the sample clock for the ADC; and
   a controller, comprising a processing unit and a memory device.

15. The ion implantation system of claim 14, further comprising an analog multiplexer, having an output in communication with the input of the ADC, and having two inputs, a first input comprising an incoming analog waveform created from the pickup loop, and a second input comprising an analog excitation voltage representative of the electrical signal supplied to the excitation coil.

16. The ion implantation system of claim 14, further comprising:
   a second analog to digital converter (ADC) comprising:
      an input comprising an analog excitation voltage representative of the electrical signal supplied to the excitation coil; an output; and a sample clock;
   a second clock delay generator, comprising: an input clock; a control input to determine an amount of delay; and an output that comprises the sample clock for the second ADC;
   wherein the output of the second ADC comprises an input to the controller, and wherein the input to the ADC comprises an incoming analog waveform created from the pickup loop.

17. The ion implantation system of claim 16, wherein the controller:
   stores the outputs from the ADC and the second ADC;
   adjusts delays used by the clock delay generator and the second clock delay generator; and
   repeatedly stores the outputs and adjusts the delays until digitized representations of the incoming analog waveform and the analog excitation voltage are created in the memory device.

18. The ion implantation system of claim 17, wherein the controller uses the digitized representations to determine phase difference between the incoming analog waveform and the analog excitation voltage, and adjusts a frequency or amplitude of the RF generator based the phase difference.

19. The ion implantation system of claim 17, wherein a resolution of the digitized representations is less than one nanosecond.

20. The ion implantation system of claim 19, wherein a maximum sample rate of the ADC and the second ADC is less than the resolution of the digitized representations.

* * * * *